(12) United States Patent
Walker et al.

(10) Patent No.: US 6,282,682 B1
(45) Date of Patent: Aug. 28, 2001

(54) AUTOMATIC TEST EQUIPMENT USING SIGMA DELTA MODULATION TO CREATE REFERENCE LEVELS

(75) Inventors: Ernest P. Walker, Weston; Ronald A. Sartschev, Dunstable; Allan M. Ryan, Jr., Billerica; Eric D. Blom, Wakefield, all of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/245,223

(22) Filed: Feb. 5, 1999

(51) Int. Cl.$^7$ ............................................ G01R 31/28
(52) U.S. Cl. ............................................ 714/738
(58) Field of Search ................................ 714/738, 724; 324/73.1, 158 R (56) References Cited

U.S. PATENT DOCUMENTS

| | | | |
|---|---|---|---|
| 4,626,769 | 12/1986 | Valley et al. | 323/283 |
| 5,107,427 | 4/1992 | Peter et al. | 364/424.03 |
| 5,225,772 | * 7/1993 | Cheung et al. | 324/158 R |
| 5,235,273 | 8/1993 | Akar et al. | 324/158 R |
| 5,512,895 | 4/1996 | Madden et al. | 341/61 |
| 5,566,188 | * 10/1996 | Robbins et al. | 714/738 |
| 5,844,513 | 12/1998 | Nishio | 341/143 |
| 6,218,972 | * 4/2001 | Groshong | 341/143 |

FOREIGN PATENT DOCUMENTS

WO 99/17179    4/1999   (WO) ............... G05F/1/10

* cited by examiner

Primary Examiner—Phung M. Chung
(74) Attorney, Agent, or Firm—Edmund J. Walsh (57) ABSTRACT

Pin slice circuitry used in automatic test equipment is disclosed. The pin slice circuitry includes a portion implemented using CMOS technology and a portion implemented using bipolar technology. The CMOS portion includes a plurality of timing generator circuits and sigma delta modulator circuitry, which is used to generate digital bit streams representative of analog reference levels. The bipolar portion includes driver/receiver channels, a parametric measurement unit, and decoder circuitry, which produces the analog reference levels from the digital bit streams generated by the modulator circuitry. The analog reference levels are used by the driver/receiver channels and the parametric measurement unit. The disclosed pin slice circuitry has the advantages of reduced size and cost as compared with conventional pin slice circuitry.

6 Claims, 5 Drawing Sheets

AUTOMATIC TEST EQUIPMENT USING SIGMA DELTA MODULATION TO CREATE REFERENCE LEVELS

This invention relates generally to the generation of analog reference levels, and more specifically to automatic test equipment in which analog reference levels are programmed.

Automatic test equipment (also known as a "tester") is widely used to test semiconductor devices, printed circuit boards, and other electronic components and assemblies. Many testers, especially those that are used to test semiconductor devices, use "pin slice" architecture. Such testers generally include multiple pin slice circuits, each associated with a separate pin on a device under test (DUT). Further, each pin slice circuit generally includes circuitry for generating and measuring signals at its associated pin on the DUT.

A typical tester may generate and measure signals on hundreds to a few thousand pins, each pin having its own pin slice circuitry. This means that pin slice circuitry is duplicated hundreds or thousands of times in a tester. It is therefore very important for testers to use pin slice circuits that are both area and cost efficient.

In addition, during a typical test session, it is often necessary to vary one or several analog reference voltage levels used in each pin slice circuit. This is especially the case when performing parametric tests of a DUT's drive and receive levels.

For example, a sequence of reference voltage levels may be generated and provided to certain sections of the pin slice circuits. If the steps of generating and providing changes in the reference voltage levels require a large amount of time, then the time to complete the full test session could become very long, especially if the test session called for the generation of sequences of hundreds of different reference voltage levels. It is therefore very important for testers to communicate the desired reference voltage level changes and generate new reference voltage levels quickly.

However, pin slice circuits must also generate and measure signals with a high degree of accuracy. For example, any inaccuracy in signal levels generated or measured by pin slice circuits will affect the accuracy of test results. Further, pin slice circuits must generate and measure signals at levels that are compatible with the semiconductor devices being tested.

One way of satisfying these requirements is to design pin slice circuits using a combination of different component technologies. For example, pin slice circuits have been designed using a combination of CMOS and bipolar component technologies.

Primarily because of the low power requirements of CMOS components, CMOS has become the technology of choice for many designers of computers and electronic devices. Consequently, CMOS components have become widely available and relatively inexpensive. Further, because of the desire to make computers and electronic devices both faster and smaller, the dimensions of CMOS components have decreased significantly over the years. Accordingly, portions of pin slice circuits have been designed using CMOS technology in an effort to make the circuits lower cost and more compact.

However, one shortcoming of designing circuits using CMOS technology is that it can lead to unstable and unpredictable timing characteristics. For example, timing characteristics of identical CMOS circuits have been found to vary from component-to-component.

Further, timing characteristics of CMOS components have been found to vary with temperature. For example, as frequencies of signals processed by CMOS components increase, power requirements of the CMOS components also generally increase, thereby causing the components to heat-up. This increase in temperature can affect propagation delays through the CMOS components.

Generally, this shortcoming of CMOS technology does not seriously affect the performance of most computers and electronic devices because CMOS circuits in these devices are usually synchronized with an internal clock. Such synchronous design techniques are often used to enhance the stability and predictability of electronic circuits.

Although some portions of pin slice circuits can also be synchronized with a clock inside the tester, the timing of other portions of pin slice circuits cannot be similarly synchronized. For example, the times at which pin slice circuits generate and measure signals at pins of a DUT are usually determined by the DUT, not by a clock internal to the tester.

Accordingly, when CMOS technology is used to implement circuitry for generating timing signals in pin slice circuits, known compensation techniques must generally be used to improve the timing characteristics of the CMOS circuitry. Such compensation techniques are described in U.S. patent application Ser. No. 08/510,079, assigned to TERADYNE®, Inc., Boston, Mass., USA.

Another reason why CMOS technology is sometimes not used to implement the signal generation portions of pin slice circuits is that CMOS circuits generally have low drive capabilities.

For these reasons, bipolar technology is often used for implementing signal generation and measurement portions of pin slice circuits in conventional testers. Timing characteristics of circuits made with bipolar technology are generally more stable and more predictable than CMOS circuits. Further, bipolar circuits can generally drive and measure signals at higher power levels than CMOS circuits.

Figure 1:
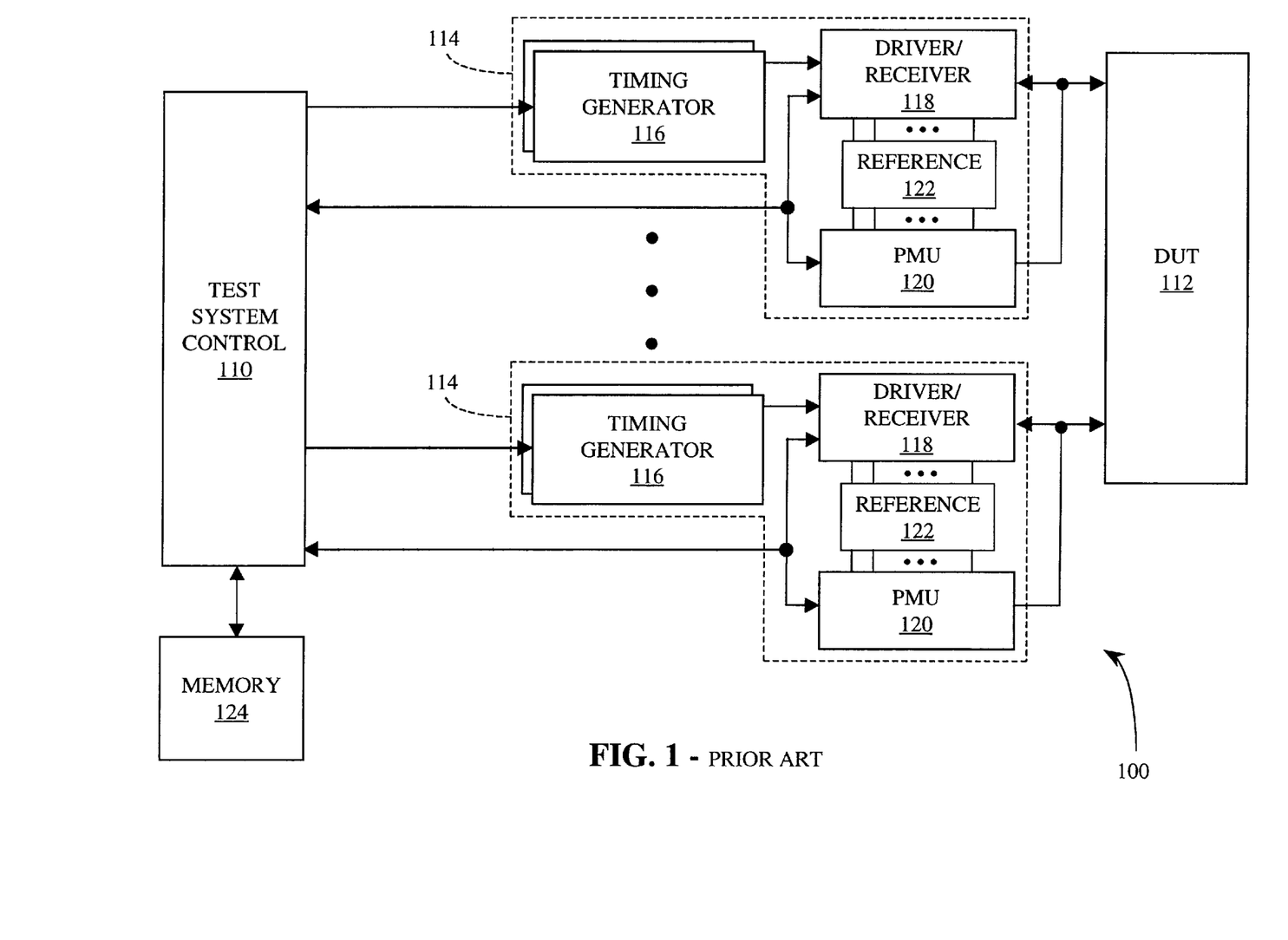
FIG. 1 is a block diagram of a conventional tester using pin slice architecture.

Such a conventional tester 100 is shown in FIG. 1. The tester 100 includes a test system controller 110, which includes a special purpose computer; and, a memory 124, which stores test results and information needed to control the tester 100. Both the test system controller 110 and the memory 124 are normally implemented using CMOS technology. This is because the test system controller 110 and the memory 124 are typically synchronized with a test system clock. Further, neither the test system controller 110 nor the memory 124 is required to drive or receive signals with high power levels.

The tester 100 also includes multiple pin slice circuits 114, which generate and measure signals at separate pins of a DUT 112, which might be a discrete semiconductor device or one of a plurality of dies on a semiconductor wafer.

Each pin slice circuit 114 typically has portions that are implemented using either CMOS or bipolar technology. For example, the pin slice circuits 114 include timing generators 116, which may be implemented using CMOS technology. In this case, the compensation techniques mentioned above are typically used to improve timing characteristics of the CMOS circuits. The timing generators 116 produce timing signals in response to commands from the test system controller 110 for determining times at which driver/receiver channels 118 drive or measure digital signals at pins of the DUT 112.

The driver/receiver channels 118 in the pin slice circuits 114 are typically implemented using bipolar technology. This ensures that the driver/receiver channels 118 have the capability of driving and measuring digital signals at pins of the DUT 112 at the proper times.

Two of the pieces of information that the test system controller 110 uses to control the pin slice circuits 114 indicate values of logical high and logical low levels to be provided by the driver/receiver channels 118 to the DUT 112; and, values of logical high and logical low levels to be received by the driver/receiver channels 118 from a properly functioning DUT 112.

In particular, the pin slice circuits 114 include reference voltages 122, which are typically implemented using discrete analog circuitry. The reference voltages 122 provide multiple reference voltages to the driver/receiver channels 118. Accordingly, the test system controller 110 provides information to the driver/receiver channels 118 indicating which reference voltages to use as logical high levels and logical low levels.

The pin slice circuits 114 also include parametric measurement units (PMU's) 120, which are typically implemented using bipolar technology and discrete analog circuitry. Whereas the driver/receiver channels 118 generate and measure digital signals, the PMU's 120 produce and measure DC levels.

The reference voltages 122 also provide multiple reference voltages to the PMU's 120. The test system controller 110 therefore provides information to the PMU's 120 indicating which reference voltages to use when producing and measuring DC levels at pins of the DUT 112.

In a typical test configuration, only the driver/receiver channel 118 or the PMU 120 in a pin slice circuit 114 is active at one time. Accordingly, switches or relays (not shown) are normally used to keep the driver/receiver channels 118 and the PMU's 120 isolated from each other.

We have recognized that a significant part of the size and cost of a pin slice circuit is due to the discrete analog circuitry used in the circuit. Because a tester may include thousands of pin slice circuits, reducing the amount of discrete analog circuitry used could substantially affect the size and cost of the tester.

We have further recognized that another significant part of the size and cost of a pin slice circuit is attributable to the size of IC's used in the circuit.

It would therefore be desirable to have a tester with reduced size and cost that can successfully test electronic devices or assemblies. It would also be desirable to achieve reduced size and cost in a tester designed using pin slice architecture.

SUMMARY OF THE INVENTION

With the foregoing background in mind, it is an object of the invention to reduce both the size and cost of a tester.

Another object of the invention is to increase the amount of pin slice circuitry that is implemented using low-cost CMOS technology.

Still another object of the invention is to reduce the size of IC's used in the pin slice circuitry.

The foregoing and other objects are achieved by providing a tester with multiple pin slice circuits, each pin slice circuit including circuitry implemented using CMOS technology and circuitry implemented using bipolar technology. In a preferred embodiment, the CMOS circuitry includes multiple digital sigma delta modulators, each digital sigma delta modulator producing a bit stream representative of a sequence of analog reference voltage levels; and, the bipolar circuitry includes multiple digital sigma delta decoders, each digital sigma delta decoder receiving a bit stream from a respective digital sigma delta modulator and converting the bit stream into a sequence of analog reference voltage levels. Each sequence of analog reference voltage levels is then provided to circuitry such as a driver/receiver channel and/or a parametric measurement unit.

According to one feature, the digital sigma delta modulator circuitry includes circuitry for combining the multiple bit streams onto a limited number of lines. According to another feature of the invention, the digital sigma delta decoder circuitry includes circuitry for segregating the multiple bit streams from the limited number of lines.

In another embodiment a serial bit stream is provided to an integrated circuit chip. Next, circuitry on the integrated circuit chip is used to segregate the serial bit stream into a plurality of segregated bit streams. The segregated bit streams are then used to generate analog reference levels for driver/receiver circuitry in the integrated circuit chip.

According to one feature, the integrated circuit chip is implemented using bipolar technology.

In still another embodiment, a semiconductor wafer is provided with a plurality of dies. Next, the dies are tested using driver/receiver circuitry implemented in an integrated circuit chip, thereby identifying good dies. The good dies are then packaged.

According to one feature, the driver/receiver circuitry is provided with reference levels produced from digital bit streams.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

Figure 2:
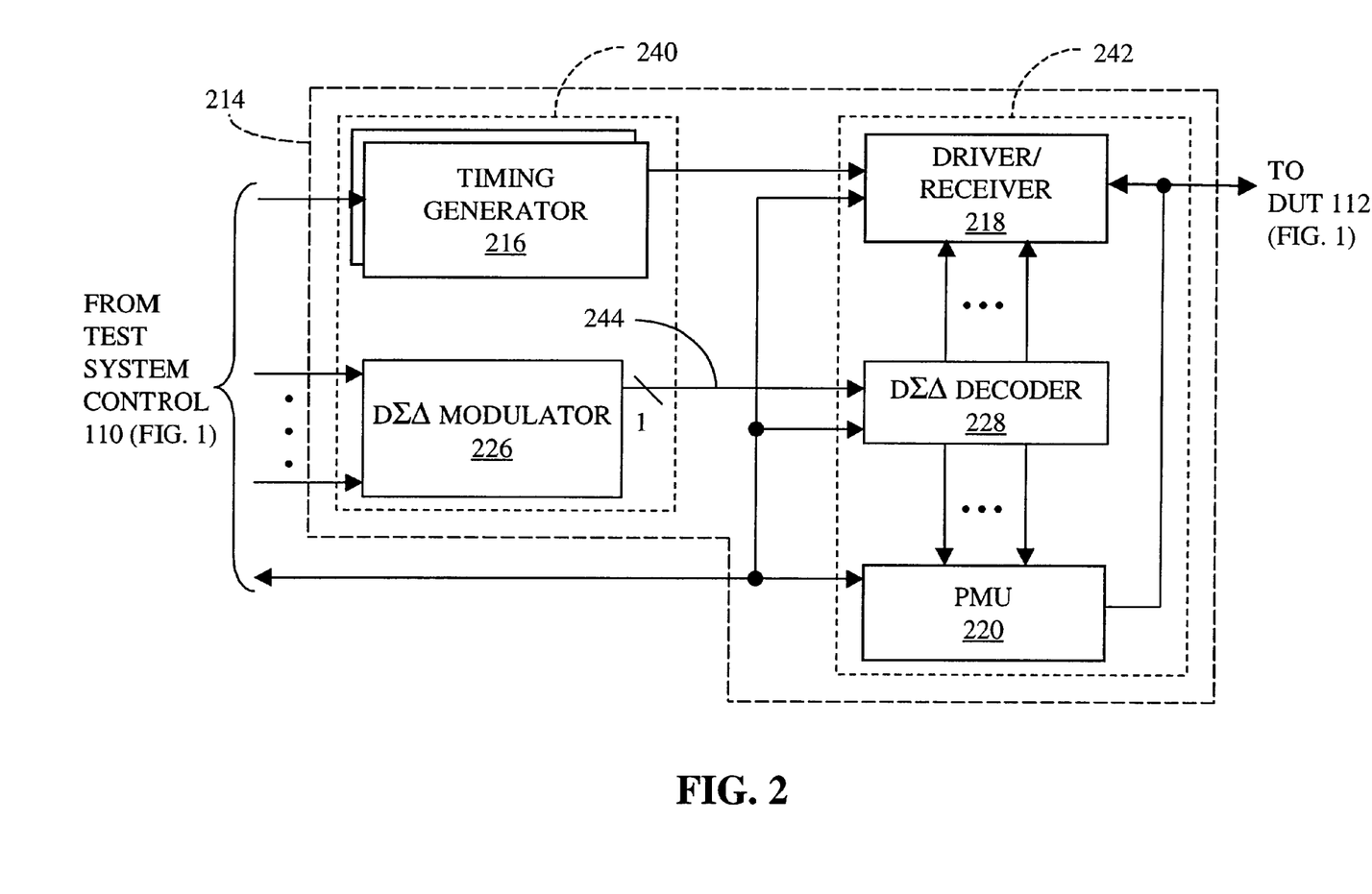
FIG. 2 is a partial block diagram of a pin slice circuit according to the invention.

FIG. 2 shows a partial block diagram of pin slice circuit 214 in accordance with the present invention. The pin slice circuit 214 is meant to be incorporated into a tester using pin slice architecture, such as the tester 100 shown in FIG. 1.

Accordingly, the pin slice circuit 214 would normally be replicated at least hundreds and likely thousands of times in a tester. Further, each replication of the pin slice circuit 214 would normally be used for generating and measuring signals and levels at a separate pin of a device under test (DUT), such as the DUT 112 shown in FIG. 1.

Because the pin slice circuit 214 is normally replicated many times in a tester, there is a strong economic incentive to reduce the size and cost of the pin slice circuit 214 as much as possible. However, the size and cost of the pin slice circuit 214 must be reduced in a way that does not adversely affect the accuracy of the signals generated and measured by the pin slice circuit 214.

For this reason, the pin slice circuit 214 is preferably implemented using a combination of circuit technologies. In particular, the pin slice circuit 214 includes a portion 240 implemented using CMOS technology and a portion 242 implemented using bipolar technology. Generally, circuitry implemented using CMOS technology can be made relatively compact, low cost, and low power. Further, circuitry implemented using bipolar technology generally has superior timing characteristics and drive capabilities. For example, emitter-coupled logic (ECL) provides the speed and drive required by most pin slice circuit applications. In this way, the size and cost of the pin slice circuit 214 can be reduced while maintaining a high level of accuracy in the generated and measured signals.

The CMOS portion 240 includes several copies of a timing generator 216, which generally produces a timing signal or "edge" a programmed amount of time after the start of a test cycle. There are several copies of the timing generator 216 because each one can be controlled by a test system controller (such as the test system controller 110 shown in FIG. 1) for performing a specific function.

For example, one timing generator can be controlled to start the generation of a test signal, while another timing generator can be controlled to stop the test signal generation. Similarly, still another timing generator can be controlled to start the measurement of a received signal, while yet another timing generator can be controlled to stop the signal measurement.

The CMOS portion 240 also includes digital sigma delta modulator (DΣΔM) circuitry 226, which is also controlled by the test system controller 110 and is preferably used for producing data relating to a series of reference voltages used by the pin slice circuit 214. A novel way of using the DΣΔM circuitry 226 to produce the reference voltages is described in detail below.

The CMOS portion 240 may include circuitry (not shown) with sequential portions that can be synchronized with a clock (not shown) internal to the tester. For example, both the timing generators 216 and the DΣΔM circuitry 226 typically include circuitry (not shown) that can be synchronized with an internal test system clock. For this reason, this circuitry in the CMOS portion 240 of the pin slice circuit 214 is usually not seriously affected by variations in the timing characteristics of CMOS circuits. These timing characteristic variations may be caused by factors such as changes in the temperature of the pin slice circuit 214, or changes in the frequency of signals processed by the pin slice circuit 214.

However, the CMOS portion 240 may also include circuitry (not shown) that cannot be similarly synchronized with an internal test system clock. For example, the timing generators 216 are generally called upon to produce edges at times dictated by the timing of the DUT, not at times solely determined by the internal test system clock. For this reason, known compensation techniques are preferably used in the timing generators 216 to improve the timing characteristics of the CMOS circuits. In this way, the timing generators 216 and the DΣΔM circuitry 226 can reap the benefits of the reduced size, cost, and power of the CMOS portion 240 of the pin slice circuit 214, while not being seriously affected by variations in the timing characteristics of the CMOS portion 240.

The bipolar portion 242 of the pin slice circuit 214 includes a driver/receiver channel 218, a parametric measurement unit (PMU) 220, and digital sigma delta decoder (DΣΔD) circuitry 228.

The edges produced by the timing generators 216 in the CMOS portion 240 are provided to the driver/receiver channel 218 in the bipolar portion 242. The driver/receiver channel 218 contains driver and comparator circuitry (see reference numerals 352 and 354, respectively, in FIG. 3) necessary for generating and measuring digital signals and levels at a pin of the DUT 112.

Similarly, the data produced by the DΣΔM circuitry 226 in the CMOS portion 240 is provided to the DΣΔD circuitry 228 in the bipolar portion 242. As mentioned above, this data relates to the reference voltages used by the pin slice circuit 214.

Further, the data produced by the DΣΔM circuitry 226 is preferably in the form of a serial bit stream. This is because the CMOS and bipolar portions 240 and 242 of the pin slice circuit 214 are preferably implemented as custom IC's; and, we have recognized that the cost of custom IC's can be reduced by minimizing the number of pins on the IC's. Accordingly, the DΣΔM circuitry 226 passes data to the DΣΔD circuitry 228 using a 1-bit wide line 244, thereby requiring only one output pad (not shown) on an IC implementing the CMOS portion 240 and only one input pad (not shown) on another IC implementing the bipolar portion.

Using the data provided by the DΣΔM circuitry 226 on the line 244, the DΣΔD circuitry 228 provides multiple reference voltages to the driver/receiver channel 218 and the PMU 220. The driver/receiver channel 218 uses selected ones of these reference voltages as logical high levels and logical low levels when generating or measuring digital signals at a pin of the DUT 112.

The DΣΔD circuitry 228 provides multiple reference voltages, preferably twenty (20), to the driver/receiver channel 218. This is because the pin slice circuit 214 is typically implemented in a dual channel configuration with ten (10) reference voltages provided to each channel. Further, the pin slice circuit 214 is typically used for testing semiconductor devices implemented using different technologies, which may operate in accordance with different logic levels. The test system controller 110 sends control signals to the driver/receiver channel 218 indicating which reference voltages to use as logical high levels and logical low levels for the different DUT technologies.

The PMU 220 also uses selected ones of the reference voltages produced by the DΣΔD circuitry 228. Whereas the driver/receiver channel 218 uses the reference voltages for defining logical high and low levels for digital signals, the PMU 220 uses the reference voltages for producing and measuring DC levels at a pin of the DUT 112. The test system controller 110 also sends control signals to the PMU 220 indicating which reference voltages to use in producing and measuring the required DC levels.

Although FIG. 2 shows outputs of the driver/receiver channel 218 and the PMU 220 providing signals and levels to a pin of the DUT 112 using the same line, it should be understood that only one of them is active at a time and there is in fact no contention for the line. Accordingly, the test system controller 110 preferably controls switches or relays (not shown) for isolating the driver/receiver channel 218 and the PMU 220 from each other during a test.

Figure 3:
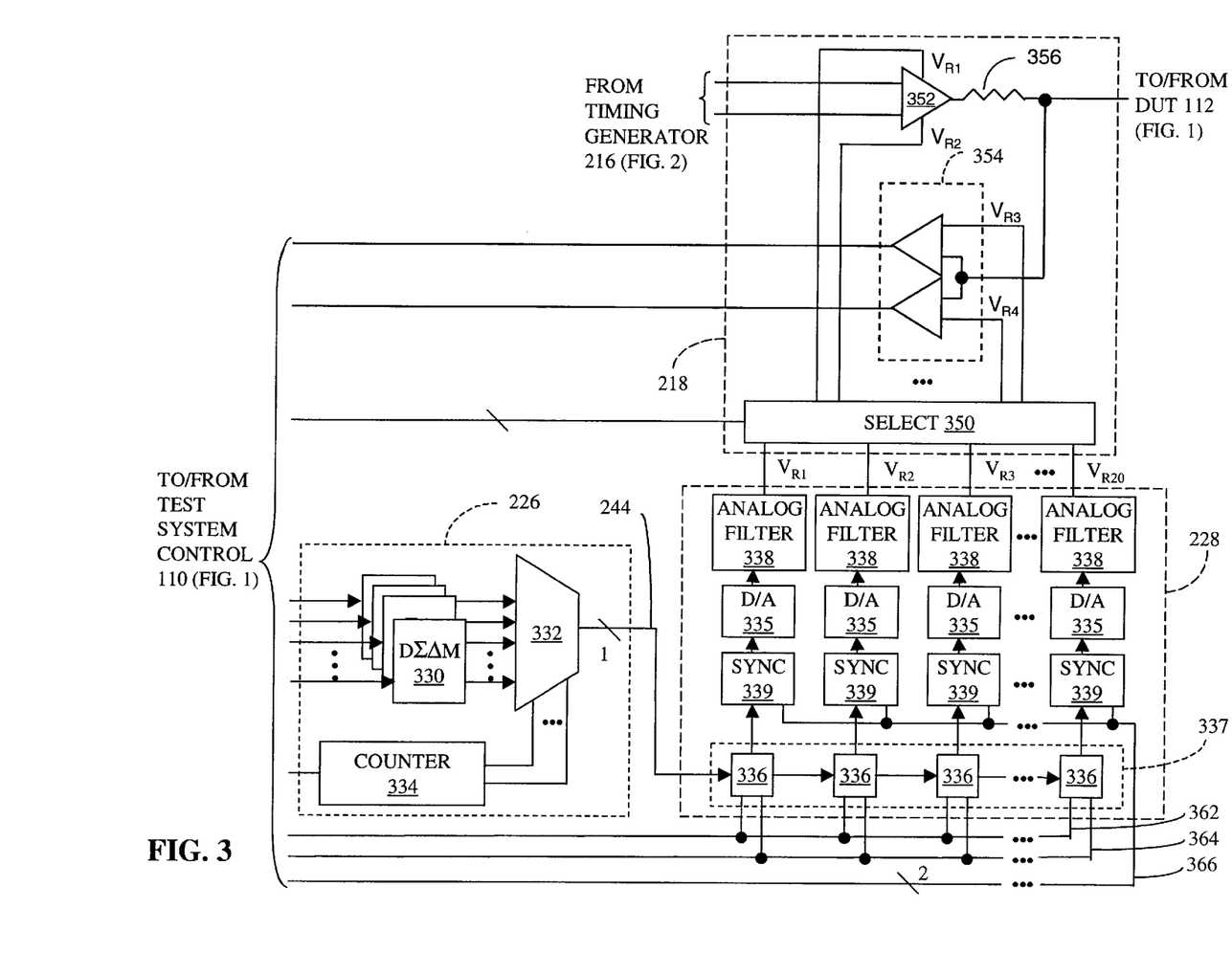
FIG. 3 is a detailed view of portions of the pin slice circuit shown in FIG. 2.

FIG. 3 shows detailed views of the DΣΔM circuitry 226, the DΣΔD circuitry 228, and the driver/receiver channel 218.

The DΣΔM circuitry 226 includes multiple DΣΔM's 330. As known to those skilled in this art, a DΣΔM is a simple, highly non-linear algorithm that can be implemented with digital circuitry and used to re-quantize high resolution digital input signals, thereby representing them as low resolution numbers at a higher sampling rate and with little loss of fidelity. One reason why DΣΔM's are used in the present invention is that they can be easily integrated with other circuits in the CMOS portion 240 of the pin slice circuit 214 using known techniques.

Low resolution, high-speed digital-to-analog (D-to-A) converters 335 (see FIG. 3), such as 1-bit D-to-A converters, can then be used to recreate the multiple reference voltages used by the driver/receiver channel 218 and the PMU 220. These D-to-A converters can be easily fabricated in minimal area, even in a bipolar process. Accordingly, this low resolution representation of high resolution digital input signals leads to an area and cost efficient way of recreating the multiple, switched-analog, reference voltages in the bipolar portion 242 of the pin slice circuit 214.

In the illustrative embodiment shown in FIG. 3, multiple DΣΔM's 330 are shown in the DΣΔM circuitry 226. This is because the driver/receiver channel 218 is shown with driver circuitry 352 for providing test signals to the DUT 112 and comparator circuitry 354 for measuring signals produced by the DUT 112. The driver circuitry 352 provides digital signals and levels to the DUT 112 that conform to a selected logical high voltage, $V_{R1}$, and a selected logical low voltage, $V_{R2}$. Similarly, the comparator circuitry 354 provides measurement outputs to the test system controller 110 that are derived using a selected logical high threshold voltage, $V_{R3}$, and a selected logical low threshold voltage, $V_{R4}$. Accordingly, the multiple DΣΔM's 330 are used to produce the reference voltages $V_{R1}$, $V_{R2}$, $V_{R3}$, and $V_{R4}$.

It should be understood that the number of DΣΔM's 330 in the DΣΔM circuitry 226 equals the number of reference voltages provided by the DΣΔD circuitry 228. Because the DΣΔD circuitry 228 provides twenty (20) reference voltages in the preferred embodiment, the DΣΔM circuitry 226 preferably includes twenty (20) DΣΔM's 330.

Each DΣΔM 330 accepts as its input a sequence of switched constant values provided by the test system controller 110. Each constant value corresponds with the desired DC level over some period of time at the reference voltage output VR1, VR2 . . . or VR20 associated with that modulator 330. Changing the constant value at the input of a DΣΔM 330 causes the numbers provided by the DΣΔM 330 to change. These numbers are then decoded, converted to analog levels, and filtered in the DΣΔD circuitry 228, thereby resulting in a new DC level at an output of the DΣΔD circuitry 228. Each output of the DΣΔD circuitry 228 is wired to an assigned voltage reference input at either the driver/receiver channel 218 or the PMU 220. In this way, the reference voltages can be specified by a tester operator during programming of the test system controller 110.

The sequence of constant values at the input of each DΣΔM 330 is then sampled and converted by the DΣΔM 330 using known techniques into an over-sampled, noise-shaped, pulse-density-modulated (ONPDM) output signal, which is preferably a 1-bit wide output stream at the frequency of the over-sampling clock (not shown). Generally, an ONPDM signal produced by a DΣΔM is characterized such that the average density of digital pulses in the ONPDM signal over a given period of time is equal to the mean value at the input of the DΣΔM over the same period of time. Accordingly, the DΣΔM's 330 produce ONPDM output signals with average pulse densities equal to the constant values at their inputs.

Further, each DΣΔM 330 samples the high resolution digital representation of the desired switched-analog reference voltage, and provides an over-sampled, noise-shaped, low resolution, digital bit stream at its output at a rate that is many times the Nyquist sampling frequency of the input signal. This is because most of the noise generated during the re-quantization will be contained in frequencies above the pass-band of analog low pass filters 338 (see FIG. 3) as the output sample rate is increased. As more of the re-quantization noise power is spectrally shaped into high frequencies, less noise appears at the outputs of the analog low pass filters 338. This manner of generating a higher rate output data stream whose noise has been moved to a more desirable portion of the frequency spectrum is commonly known as "noise-shaped, over-sampling."

In the preferred embodiment, each DΣΔM 330 produces output samples at a sampling rate of 5 MHz, which allows the representation of signal frequencies up to a Nyquist limit of 2.5 MHz. If the analog low pass filters 338 are designed for a pass-band that rolls off steeply after 10 kHz, then the ratio of the over-sampled bandwidth to the analog output bandwidth will be 250 to 1, which is expected to be sufficient to provide analog output signals with the desired noise level.

As mentioned above, the cost of custom IC's can be reduced by minimizing the number of pins on the IC's. For this reason, the ONPDM outputs generated by the DΣΔM's 330 are provided to a multiplexor 332, which produces a time-multiplexed sequence of the outputs from the DΣΔM's 330 on the 1-bit wide line 244.

In particular, the DΣΔM's 330 preferably sample the values at their inputs synchronously. Consequently, bits in the output streams produced by respective DΣΔM's 330 are presented to the inputs of the multiplexor 332 in a synchronous manner. Further, the inputs of the multiplexor 332 are sequentially selected by a counter 334. In this way, the bits in the output streams produced by the DΣΔM's 330 are placed on the 1-bit wide line 244 in a sequential manner.

As mentioned above, the DΣΔM circuitry 226 preferably includes twenty (20) DΣΔM's 330. This means that the multiplexor 332 preferably has twenty (20) inputs for combining twenty (20) PDM outputs on the line 244. Further, the twenty (20) inputs of the multiplexor 332 are sequentially selected by the counter 334. In this way, bits in the output streams produced by the twenty (20) DΣΔM's 330 are placed on the line 244 in a sequential manner.

The test system controller 110 is programmed to control the DΣΔM's 330 and the counter 334 to ensure that the counter 334 counts through a complete cycle only when a new set of twenty (20) bits is available at the inputs of the multiplexor 332. Accordingly, the clock frequency of the counter 334 must be twenty (20) times the sampling rate of the DΣΔM's 330. Using the preferred sampling frequency of 5 MHz, this means that the clock frequency of the counter 334 must be 100 MHz.

The combined output stream on the line 244 is then provided to a shift register 337 included in the DΣΔD circuitry 228. The shift register 337 is used to segregate the output streams produced by the twenty (20) DΣΔM's 330 from the combined output stream on the line 244. Further, the test system controller 110 is programmed to control the application of a clock signal on line 362 and a sync signal on line 364 to the shift register 337.

In particular, the frequency of the clock signal applied to the shift register 337 on the line 362 must equal the clock frequency of the counter 334. For example, a 100 MHz clock applied to the counter 334 causes the multiplexor 332 to produce a bit stream on the line 244 at a frequency of 100 MHz. This means that the shift register 337 must also be clocked at a 100 MHz rate in order to shift twenty (20) bits at a time into twenty (20) registers 336. Further, whenever a new set of twenty (20) bits is available in the registers 336, outputs of the registers 336 are enabled and twenty (20) data pulses are simultaneously presented to twenty (20) identical synchronizing gates 339. In this way, each gate 339 is presented with a bit stream produced by a respective DΣΔM 330.

The test system controller 110 provides each gate 339 with a window signal on line 366. The window signal is preferably a differential signal for maximizing edge timing accuracy. For this reason, the line 366 is shown as a 2-bit wide line. Further, the window signal is used in conjunction with the gates 339 for controlling the width of the data pulses, and for ensuring that the data pulses in each stream are spaced far enough apart so that settling time does not affect the data pulse width.

Next, the gates 339 present the data streams to respective D-to-A converters 335. The D-to-A converters 335 convert the digital numbers to noisy versions of the desired DC levels. The analog outputs of the D-to-A converters 335 are then low pass filtered by the analog low pass filters 338, thereby removing most of the noise. It should be noted that the specific implementations of the low-resolution D-to-A converters 335 and the analog filters 338 are not critical to the invention.

The reference voltages $V_{R1}$ through $V_{R20}$ produced by the filters 338 are then provided to selection circuitry 350 included in the driver/receiver channel 218. The test system controller 110 is programmed to control the selection circuitry 350, thereby presenting the proper reference voltages to the driver 352 and the comparator 354. For example, the selection circuitry 350 is controlled to provide reference voltages $V_{R1}$ and $V_{R2}$ to the driver 352, which produces digital test signals using timing edges provided by the timing generator 216. The digital test signals may be produced with logical high levels equal to $V_{R1}$ and logical low levels equal to $V_{R2}$ and then passed through a back-match resister 356 to the DUT 112.

Similarly, the selection circuitry 350 is controlled to provide reference voltages $V_{R3}$ and $V_{R4}$ to the comparator 354, which compares or measures signals produced by the DUT 112 relative to the reference voltages. The DUT signals may be compared with a logical high threshold voltage equal to $V_{R3}$ and a logical low threshold voltage equal to $V_{R4}$. The comparator 354 then passes measurement results to the test system controller 110 for subsequent analysis.

It should be noted that the reference voltages $V_{R1}$ through $V_{R20}$ might be similarly provided to selection circuitry (not shown) included in the PMU 220. The test system controller 110 would therefore be programmed to control this selection circuitry for presenting the proper reference voltages to DC level generation and measurement circuitry in the PMU 220.

Figure 4:
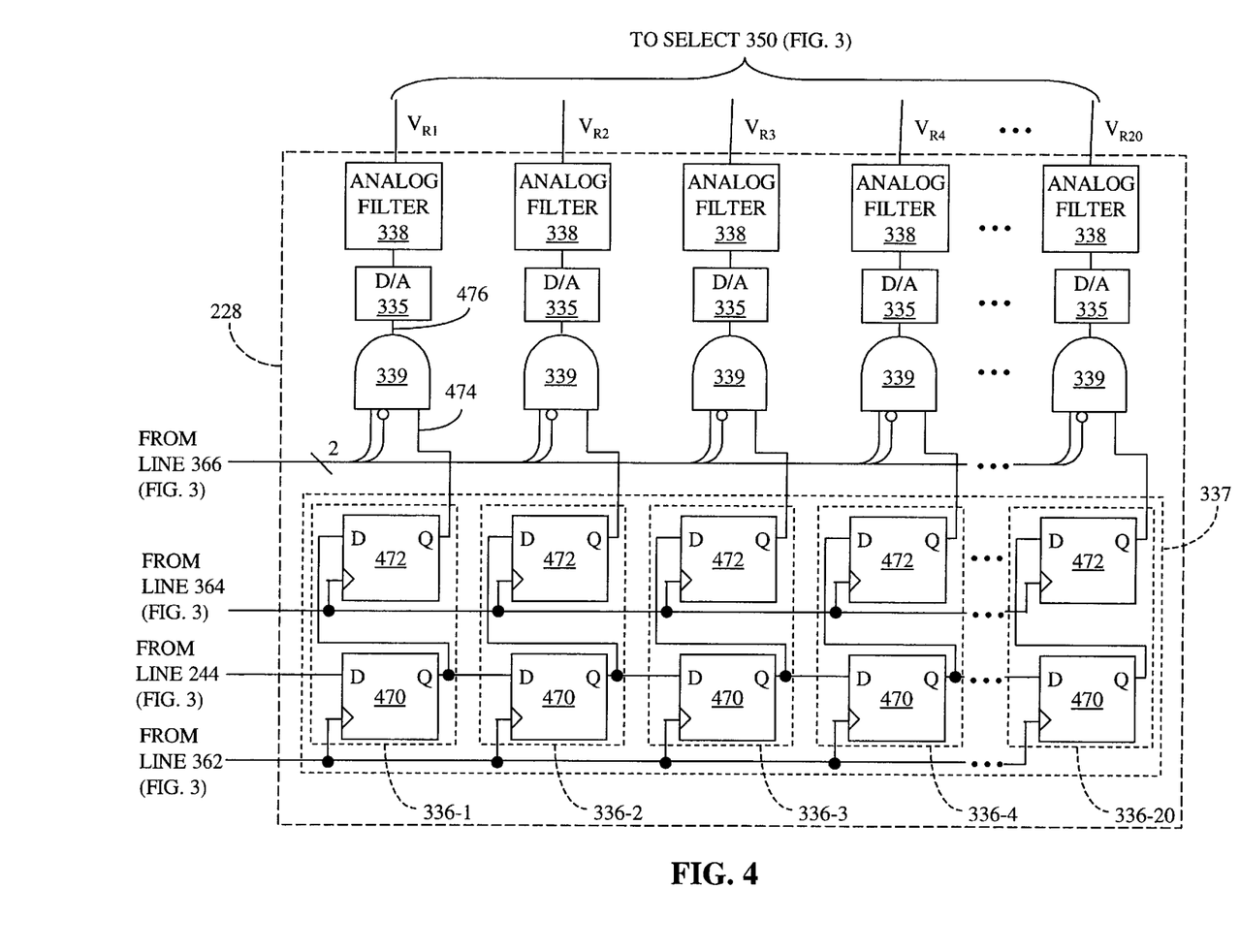
FIG. 4 is a schematic diagram of decoder circuitry included in the pin slice circuit shown in FIG. 2.

FIG. 4 shows a schematic diagram of the DΣΔD circuitry 228. In particular, the 100 MHz bit stream produced by the multiplexor 332 is provided to the first register 336-1 in the shift register 337 on the line 244. Each of the registers 336-1 through 336-20 preferably include respective registers 470 and 472, which may be implemented using conventional D-flip-flops. Further, each of the respective registers 470 are serially connected as shown in FIG. 4.

As mentioned above, the shift register 337 is preferably clocked at a 100 MHz rate in order to shift twenty (20) bits from the bit stream on the line 244 into the twenty (20) registers 336. Accordingly, the 100 MHz clock is provided to the respective registers 470 on the line 362. Further, whenever a new set of twenty (20) bits is available in the respective registers 470, the sync signal is applied on the line 364, thereby latching the twenty (20) bits in the respective registers 472. Because the sets of twenty (20) bits are preferably clocked into the registers 470 at a 100 MHz rate, the sync signal is applied to the line 364 at a 5 MHz rate.

Each set of bits latched in the registers 472 are then presented to the sync gates 339, which may be implemented using a conventional AND-gate configuration. The operation of the sync gates 339 may be described using the timing diagram shown in FIG. 5.

Figure 5:
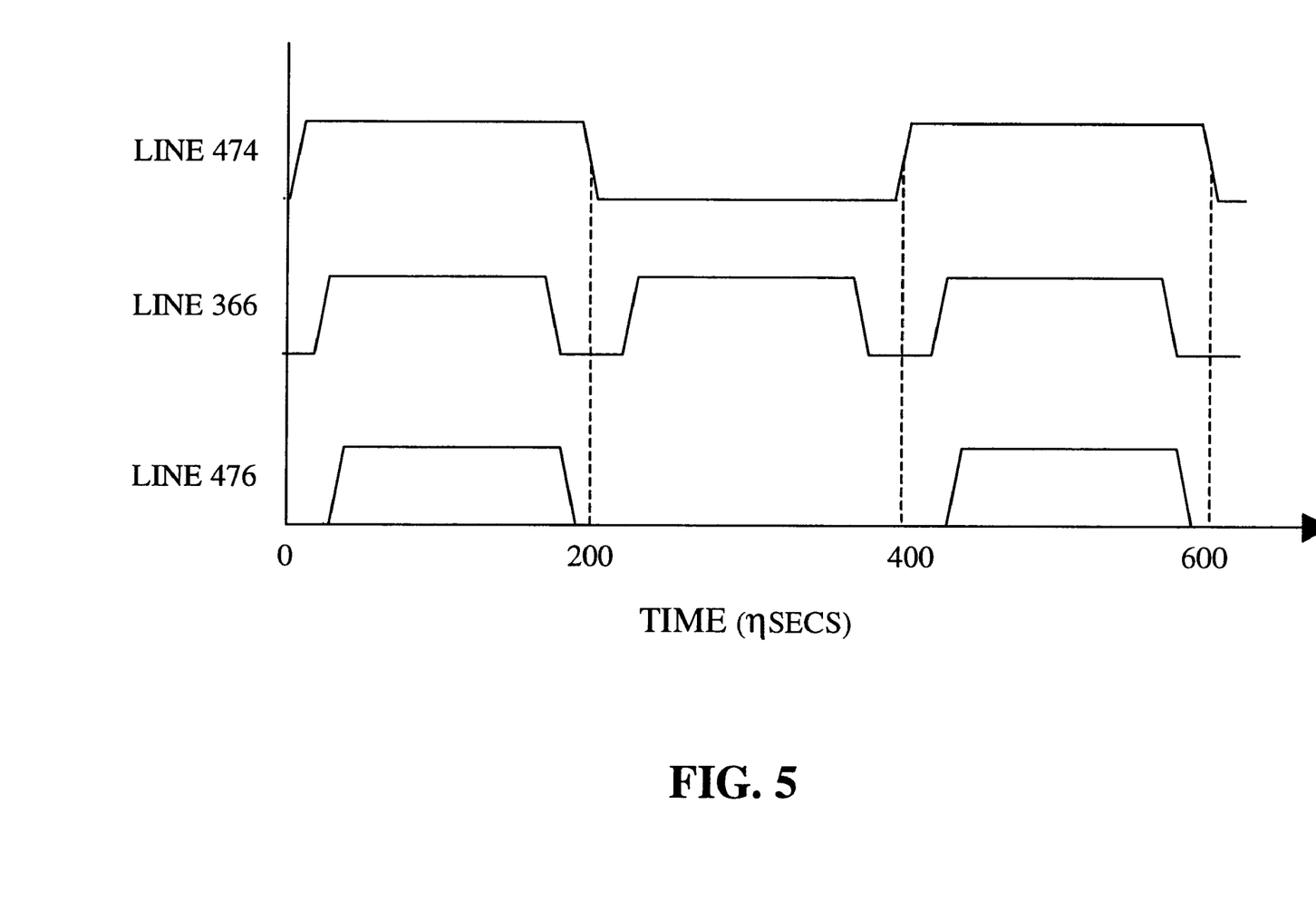
FIG. 5 is a timing diagram used to describe the operation of the decoder circuitry shown in FIG. 4.

For example, FIG. 5 shows a series of data pulses on line 474 (FIG. 4), which is connected to an input of one of the sync gates 339. The series of data pulses corresponds to a bit stream produced by one of the DΣΔM's 330. Further, because each DΣΔM 330 preferably samples the value at its input using a sampling frequency of 5 MHz, the width of each data pulse on the line 474 is 200 ηsecs. Accordingly, a data bit with a value of logical "1" occurs between times 1 and 200 ηsecs; a data bit with a value of logical "0" occurs between times 200 ηsecs and 400 ηsecs; and, a data bit with a value of logical "1" occurs between times 400 ηsecs and 600 ηsecs.

FIG. 5 also shows the window signal on the line 366. As mentioned above, the window signal is preferably a differential signal. Accordingly, FIG. 4 shows the line 366 as a 2-bit wide line connected to two inputs of each sync gate 339.

We have recognized that accuracy can be improved by precisely controlling the width and spacing of the data pulses provided by the registers 472. To this end, the sync gate 339 synchronizes the data on the line 474 with the window signal on the line 366. The synchronized data on the line 476 (FIG. 5) are then presented to the filter 338.

As shown in FIG. 5, the width of the data pulses on the line 476 equals the width of the pulses on the line 366; and, the minimum spacing between adjacent data pulses on the line 476 is equal to the spacing between the pulses on the line 366. Further, if the register 472 provides the sync gate 339 with a data bit having a value of logical "1" then the sync gate 339 provides a pulse with a fixed width to the filter 338. Alternatively, if the register 472 provides the sync gate 339 with a data bit having a value of logical "0," then the sync gate 339 sends no pulse to the filter 338. Finally, the filters 338 convert these data bit streams from PDM signals to PCM signals with constant values equal to the desired DC reference voltages $V_{R1}$ through $V_{R20}$.

Having described one embodiment, numerous alternative embodiments or variations might be made. For example, it was described that the pin slice circuit has a CMOS portion and a bipolar portion; and, that the timing generator and the DΣΔ modulator circuitry are in the CMOS portion while the DΣΔ decoder circuitry, the driver/receiver channel, and the PMU are in the bipolar portion. However, this was merely an illustrative example. The pin slice circuit might be configured with different circuit blocks in the CMOS and bipolar portions.

For example, the DΣΔ decoder circuitry might be included in the CMOS portion. This would eliminate the need for combining multiple bit streams using a multiplexor and a counter, and then segregating the bit streams using a shift register. Further, this would require more pins in corresponding IC's for passing the reference voltages from the DΣΔ decoder circuitry in the CMOS IC to the driver/receiver channel and PMU in the bipolar IC, which could make the resulting system less cost and area efficient.

Further, the selection circuitry in the driver/receiver channel might be removed entirely and the reference voltages routed directly to the driver and comparator circuitry.

In addition, the DΣΔ modulators described herein are preferably second-order modulators. However, higher-order modulators may be used for further reducing residual noise on the reference voltages after low pass filtering. Because higher order modulators generally require higher orders of analog filtering, the overall circuit complexity can be expected to increase, thereby reducing the area and cost efficiency.

Therefore, the invention should be limited only by the spirit and scope of the appended claims.

What is claimed is:

1. A semiconductor chip with at least one output pad, adapted for use in an automatic test system, comprising:

a plurality of modulation circuits, each modulation circuit having a control input and an output,
      wherein each modulation circuit produces a respective stream of digital bits at its output representative of a value at its control input; and
   a combining circuit having a plurality of inputs and an output,
      wherein each input of the combining circuit is coupled to an output of a modulation circuit and the output of the combining circuit is connected to the output pad, and
      wherein the combining circuit forms a stream of digital bits at its output from the respective streams of digital bits at its plurality of inputs.

2. The semiconductor chip as recited in claim 1, wherein the chip is implemented using CMOS technology.

3. The semiconductor chip as recited in claim 1, further including a plurality of timing generator circuits, each timing generator circuit having a control input and an output having a signal thereon at a time determined by the value on the control input, and
   wherein the outputs of the timing generator circuits are coupled to output pads of the semiconductor chip.

4. The semiconductor chip as recited in claim 1, wherein the plurality of modulation circuits include digital sigma delta modulators.

5. An automatic test system comprising the semiconductor chip as recited in claim 1, further including a second semiconductor chip comprising:

at least one driver/receiver channel formed thereon, the driver/receiver channel having a plurality of reference inputs;
   de-combining circuitry having an input and a plurality of outputs, the input being coupled to the output of the combining circuit and the outputs carrying digital signals segregated from the stream of digital bits; and
   a plurality of conversion circuits, each having a digital input coupled to an output of the de-combining circuitry and an analog output coupled to a reference input of the driver/receiver channel.

6. The automatic test system as recited in claim 5, wherein the semiconductor chip as recited in claim 1 is implemented using CMOS technology, and the second semiconductor chip is implemented using bipolar technology.

* * * * *